July 31, 1962 S. NAPOLIN ET AL 3,047,824

TUNER CHASSIS WITH INTEGRAL SHIELD AND CONDENSER PLATE

Filed Dec. 18, 1959 2 Sheets-Sheet 1

INVENTOR.
SEYMOUR NAPOLIN
BY [signature]
ATTORNEY

TUNER CHASSIS WITH INTEGRAL SHIELD AND CONDENSER PLATE

Filed Dec. 18, 1959 2 Sheets-Sheet 2

INVENTORS.
SEYMOUR NAPOLIN
MARK H. HARWOOD
BY [signature]
ATTORNEY

United States Patent Office 3,047,824
Patented July 31, 1962

3,047,824

TUNER CHASSIS WITH INTEGRAL SHIELD AND CONDENSER PLATE

Seymour Napolin, Westbury, and Mark H. Harwood, Syosset, N.Y., assignors to Granco Products, Inc., Long Island City, N.Y., a corporation of New York Filed Dec. 18, 1959, Ser. No. 860,578
4 Claims. (Cl. 334—46)

This invention relates to the mounting of electronic tuning devices and especially to the mounting of frequency modulation tuners.

One of the objects of the invention is to provide a chassis supporting the tuning elements of a frequency modulation tuner preferably inside and outside thereof and having parts stamped out from such chassis and forming adjustable tunning elements for the tuning device.

Another object of the invention is to provide in the chassis of a frequency modulation tuner a projection stamped out therefrom and cooperating with a part of the tuning device so as to permit adjustment of tuning conditions during assembly.

Still another object of the invention is to provide on the chassis of a frequency modulation tuning device a recessed portion forming a screen for a part of the tuning device preferably supported on the chassis outside thereof, and separated by the recessed portion from other tuning elements supported within said chassis.

A more specific object of the invention is to provide on the wall of a chassis supporting adjustable tuning elements inside thereof a stamped out piece extending inside such chassis and arranged in juxtaposed relationship with a tuning coil and permitting adjustment of such relationship by adjusting the position of such stamped out piece with respect to such tuning coil.

A further specific object of the invention is to provide in a side wall of the chassis of a frequency modulation tuner surrounding and supporting tuning elements inside thereof, a stamped out portion of substantially circular shape and extending while connected to such wall inside to the chassis at an angle of substantially 90° with respect to such wall, such circular portion being arranged aligned with a substantially circular tuning coil at one end thereof and permitting adjustment during assembly by bending such flat round piece toward or away from that coil end.

Figure 1:
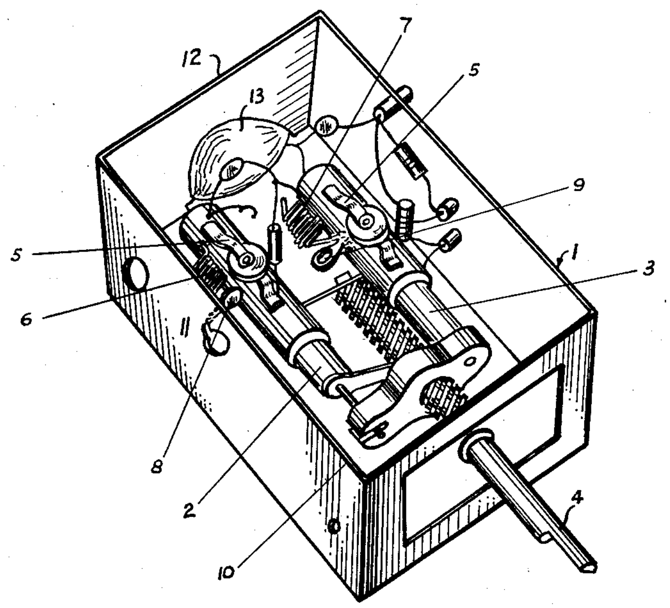

These and other objects of the invention will be more fully apparent from the drawings annexed herewith in which FIG. 1 shows a perspective view of a chassis of a frequency modulation tuner supporting circuit elements and embodying certain features of invention.

Figure 2:
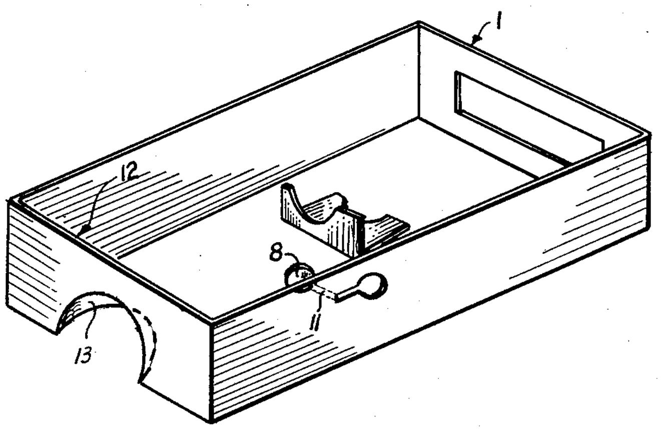

FIG. 2 shows, also in perspective, the relative arrangement of bent out and stamped out means on an empty chassis.

Figure 3:
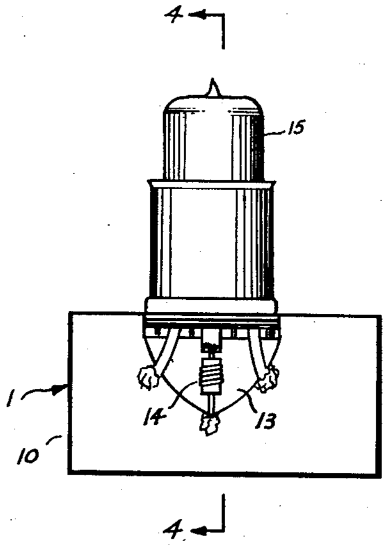
Figure 4:
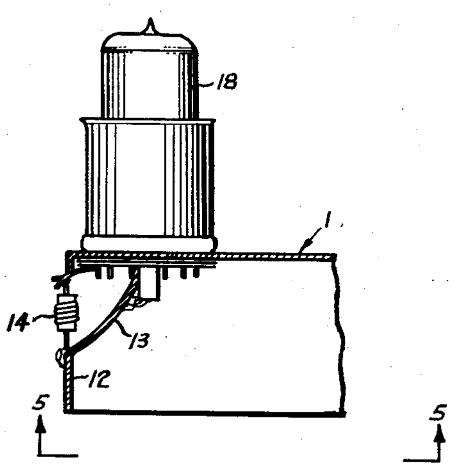

FIGS. 3 and 4 in front and side elevations respectively, the latter in section, show in greater detail a bent out portion of a chassis of a frequency modulation tuner forming a screen for a circuit element arranged supported on the chassis outside thereof.

Figure 5:
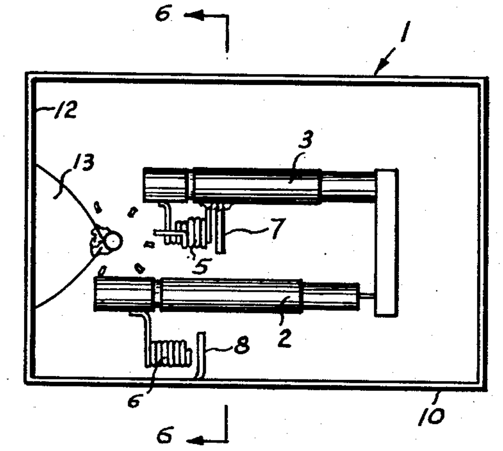
Figure 6:
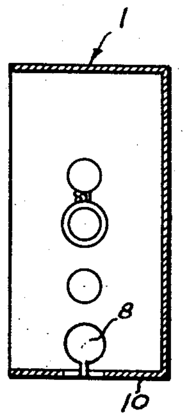

FIGS. 5 and 6 in back and side elevations respectively, the latter in section, show a stamped out portion of the chassis for adjusting the effect of a coil arranged within the chassis.

In FIGS. 1 and 2 a chassis of a frequency modulation tuner is shown at 1 supporting among other elements inside thereof a pair of plunger type tuning condensers 2, 3 adjustable through a shaft extending at 4. The tuning condensers 2, 3 are shunted by trimmer condensers 5 supported thereon, and inductance coils 6, 7 serve to further determine the tuning characteristics. The effect of inductance coils 6, 7 is adjusted by metal platelets, discs, or rings 8, 9 each facing in accordance with the invention one end of inductance coils 6, 7 in an adjustable position.

In accordance with a preferred embodiment of the invention one of these platelets, for example disc 8, is produced from a stamped out portion in wall 10 of chassis 1 and its relative adjustment with respect to its coil 6 is effected by simply bending disc 8 over its leg 11 to and from with respect to the end of coil 6.

In accordance with another feature of the invention the rear wall 12 of chassis 1 is bent inward as indicated at 13 to form a screen for a separate element such as a coil supported close to that cavity but outside of chassis 1.

The arrangement of the circuit elements stamped out and bent out, respectively, from chassis 1 is more clearly indicated on an empty chassis such as shown in FIG. 2.

FIGS. 3 and 4 show in greater detail the arrangement of the bent out portion 13 and the circuit element such as a coil 14 supported therein. Apart from that chassis 1 is shown to support on top thereof an oscillator tube 15 in otherwise well known manner.

In the arrangement of FIGS. 3–5 and 6 representing a bottom view and a side view, respectively, of the chassis, the latter view in section, there are shown again tuning capacitors 2, 3, coils 5, 6 together with the platelets 8, 9 with adjustment disc 8 being stamped out from the side wall 10 of chassis 1.

The invention is not limited to the relative arrangement of the circuit elements shown and described nor to their particular structures and connections but may be applied to any form or manner whatsoever without departing from the scope of this disclosure.

We claim:

1. In a frequency modulation tuner, a metal chassis supporting therein adjustable and fixed tuning elements, means supported on said chassis outside thereof for adjusting said adjustable tuning elements, said fixed tuning elements including at least one inductance coil coupled to said adjustable tuning elements supported within said chassis parallel to one side wall between said side wall and one of said adjustable tuning elements, said side wall having a portion partially stamped out therefrom without being completely cut off from the wall forming a substantially perpendicular projection integrally connected with said wall extending into said chassis facing one end of said fixed coil, said stamped out wall portion being bendable to and fro with respect to said fixed coil end so as to preadjust the tuning during assembly of the tuner.

2. Tuner according to claim 1 wherein said stamped out portion extends substantially perpendicular to said wall and said fixed coil extends substantially parallel to said wall, facing with one end said stamped out portion.

3. Tuner according to claim 1 wherein said chassis at one portion thereof is bent towards its inside, the resulting cavity having supported thereon outside of said chassis a circuit element in a position at least partially surrounded by said cavity so as to be screened by the wall of said cavity from the circuit elements inside said chassis.

4. Tuner according to claim 3 wherein said chassis is of substantially rectangular shape; said stamped out portion being provided in one wall of such rectangle and said cavity provided in another wall of said rectangle substantially perpendicular to said first wall.

References Cited in the file of this patent

UNITED STATES PATENTS

| | | |
|---|---|---|
| 2,046,927 | Riley | July 7, 1936 |
| 2,795,693 | Fisher et al. | June 11, 1957 |
| 2,835,874 | First et al. | May 20, 1958 |
| 2,875,338 | Holmes | Feb. 24, 1959 |
| 2,913,683 | Mason | Nov. 17, 1959 |

FOREIGN PATENTS

| | | |
|---|---|---|
| 147,955 | Austria | Dec. 10, 1936 |